US00RE45462E

(19) United States
(12) Reissued Patent
Mori et al.

(10) Patent Number: US RE45,462 E
(45) Date of Reissued Patent: Apr. 14, 2015

(54) SEMICONDUCTOR DEVICE

(75) Inventors: Shinji Mori, Yokohama (JP); Tsutomu Sato, Oita (JP); Koji Matsuo, Yokohama (JP)

(73) Assignee: Kabushiki Kaisha Toshiba, Tokyo (JP)

(21) Appl. No.: 13/569,604

(22) Filed: Aug. 8, 2012

Related U.S. Patent Documents

Reissue of:
(64) Patent No.: 8,013,398
Issued: Sep. 6, 2011
Appl. No.: 12/056,909
Filed: Mar. 27, 2008

(30) Foreign Application Priority Data

Mar. 29, 2007 (JP) ..... 2007-088836

(51) Int. Cl.
*H01L 29/78* (2006.01)
*H01L 29/772* (2006.01)

(52) U.S. Cl.
CPC ..... *H01L 29/772* (2013.01)

(58) Field of Classification Search
CPC ..... H01L 29/7842; H01L 29/7848
USPC ..... 257/369, E29.255; 438/229
See application file for complete search history.

(56) References Cited

U.S. PATENT DOCUMENTS 6,621,131 B2 9/2003 Murthy et al.
7,132,338 B2 11/2006 Samoilov et al.
7,579,248 B2 * 8/2009 Huang et al. ..... 438/300
7,608,489 B2 * 10/2009 Chidambarrao et al. ..... 438/142
2001/0045604 A1 * 11/2001 Oda et al. ..... 257/350
2003/0127663 A1 * 7/2003 Ito ..... 257/204
2004/0132249 A1 * 7/2004 Mitsuda et al. ..... 438/260
2005/0059196 A1 * 3/2005 Noda et al. ..... 438/197
2005/0280098 A1 12/2005 Shin et al.
2006/0134873 A1 * 6/2006 Koontz ..... 438/301
2006/0214225 A1 * 9/2006 Holt et al. ..... 257/347
2007/0018205 A1 * 1/2007 Chidambarrao et al. ..... 257/288
2007/0257321 A1 * 11/2007 Ting et al. ..... 257/369
2008/0119031 A1 * 5/2008 Pal et al. ..... 438/483

(Continued)

FOREIGN PATENT DOCUMENTS

JP 2006-121074 5/2006
JP 2006-228958 8/2006

(Continued)

OTHER PUBLICATIONS

First Office Action issued by the Japanese Patent Office on Jun. 18, 2013, in counterpart Japanese Patent Application No. 2011-233122.

(Continued)

*Primary Examiner* — Steven J Fulk
(74) *Attorney, Agent, or Firm* — Finnegan, Henderson, Farabow, Garrett & Dunner, LLP

(57) ABSTRACT

A semiconductor device includes a first pMISFET region having an Si channel, a second pMISFET region having an Si channel and an nMISFET region having an Si channel. First SiGe layers which apply first compression strain to the Si channel are embedded and formed in the first pMISFET region to sandwich the Si channel thereof and second SiGe layers which apply second compression strain different from the first compression strain to the Si channel are embedded and formed in the second pMISFET region to sandwich the Si channel thereof.

14 Claims, 10 Drawing Sheets

(56) References Cited

U.S. PATENT DOCUMENTS

| | | | | |
|---|---|---|---|---|
| 2008/0179627 | A1* | 7/2008 | Ieong et al. | 257/190 |
| 2008/0191244 | A1* | 8/2008 | Kim et al. | 257/190 |

FOREIGN PATENT DOCUMENTS

| | | |
|---|---|---|
| JP | 2006-253317 | 9/2006 |
| JP | 2006-303451 | 11/2006 |
| JP | 2006-332337 | 12/2006 |
| JP | 2007-48788 | 2/2007 |
| JP | 2007-200961 | 8/2007 |
| JP | 2007-36205 | 2/2008 |

OTHER PUBLICATIONS

Notice of Reasons for Rejection mailed by the Japanese Patent Office on Jun. 8, 2010, for Japanese Applicaiton No. 2007-088836 and English translation thereof.

Notice of Reasons for Rejection mailed by Japanese Patent Office on Aug. 18, 2009, for Japanese Application No. 2007-088836 and English translation thereof.

* cited by examiner

SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*This application is a reissue application of U.S. Pat. No. 8,013,398.* This application is *also* based upon and claims the benefit of priority from prior Japanese Patent Application No. 2007-088836, filed Mar. 29, 2007, the entire contents of which are incorporated herein by reference.

BACKGROUND OF THE INVENTION

1. Field of the Invention

This invention relates to a semiconductor device and a manufacturing method thereof, and more particularly, to a semiconductor device in which the mobility is enhanced by embedding silicon germanium (SiGe) in source/drain regions of MISFETs and straining Si channels and a manufacturing method of the semiconductor device.

2. Description of the Related Art

As a manufacturing method of CMOS transistors having high drivability, the technique (so-called strained Si technique) for enhancing the mobility by straining silicon (Si) and applying stress to channel regions is known. Particularly, as one example of an element structure manufactured by the use of the strained Si technique, an eSiGe technique gains much attention. The eSiGe technique is a method for enhancing the mobility by embedding SiGe layers in the source/drain regions of pMISFET regions and applying compression stress to the Si channel regions (for example, refer to U.S. Pat. No. 6,621,131).

In the structure in which the SiGe layers are embedded in the source/drain regions of the pMISFET, stress to the channel region increases in proportion to the germanium (Ge) concentration in the SiGe layers. Therefore, the mobility is more enhanced as the Ge concentration becomes higher. However, since a risk caused by crystal defects in the SiGe layer becomes higher in proportion to the Ge concentration, there is a possibility that a problem of abnormal growth of salicide or junction leak (J/L) will occur when the Ge concentration becomes high.

In an LSI, not only elements having high drivability but also elements having high reliability are required. When the Ge concentration in the SiGe layer is made higher in order to manufacture elements having the high drivability, a risk due to the crystal defects in the SiGe layer increases, and as a result, the high reliability cannot be attained. That is, in the conventional method, both of pMISFETs having the high drivability and pMISFETs having the high reliability cannot be formed together in one chip.

BRIEF SUMMARY OF THE INVENTION

According to one aspect of the present invention, there is provided a semiconductor device which includes a semiconductor substrate, a first pMISFET region formed on the semiconductor substrate and having a first Si channel, first SiGe layers which apply first compression strain to the first Si channel being embedded and formed in the first pMISFET region to sandwich the first Si channel, a second pMISFET region formed on the semiconductor substrate to be electrically isolated from the first pMISFET region and having a second Si channel, second SiGe layers which apply second compression strain different from the first compression strain to the second Si channel being embedded and formed in the second pMISFET region to sandwich the second Si channel, and an nMISFET region formed on the semiconductor substrate to be electrically isolated from the first and second pMISFET regions and having a third Si channel.

According to another aspect of the present invention, there is provided a manufacturing method of a semiconductor device which includes forming a first pMISFET region, second pMISFET region and nMISFET region which are electrically isolated from one another by forming an element isolation region on a well on an Si substrate, forming a first mask which covers the second pMISFET region and nMISFET region, selectively embedding and forming first SiGe layers which apply first compression strain to an Si channel of the first pMISFET region in the first pMISFET region by the use of the first mask, removing the first mask after formation of the first SiGe layers, forming a second mask which covers the first pMISFET region and nMISFET region after removing the first mask, and selectively embedding and forming second SiGe layers which apply second compression strain different from the first compression strain to an Si channel of the second pMISFET region in the second pMISFET region by the use of the second mask.

According to still another aspect of the present invention, there is provided a manufacturing method of a semiconductor device which includes forming a first pMISFET region, second pMISFET region and nMISFET region which are electrically isolated from one another by forming an element isolation region on a well on an Si substrate, forming a mask which covers the nMISFET region, forming recesses to sandwich Si channels of the first and second pMISFET regions by selectively etching the first and second pMISFET regions under a condition that Si aperture ratios of the first and second pMISFET regions are made different with the nMISFET region covered with the mask in a case where a ratio of an area of an exposed Si substrate to an entire area of one cell region containing one MISFET region and an element isolation region surrounding the MISFET region is defined as an Si aperture ratio, and forming first SiGe layers which apply first compression strain to the Si channel of the first pMISFET region in the recesses of the first pMISFET region and forming second SiGe layers which apply second compression strain different from the first compression strain to the Si channel of the second pMISFET region in the recesses of the second pMISFET region.

DETAILED DESCRIPTION OF THE INVENTION

There will now be described embodiments of the present invention with reference to the accompanying drawings. The following contents are shown as embodiments of this invention and this invention is not limited to the following contents.

First Embodiment

Figure 1:
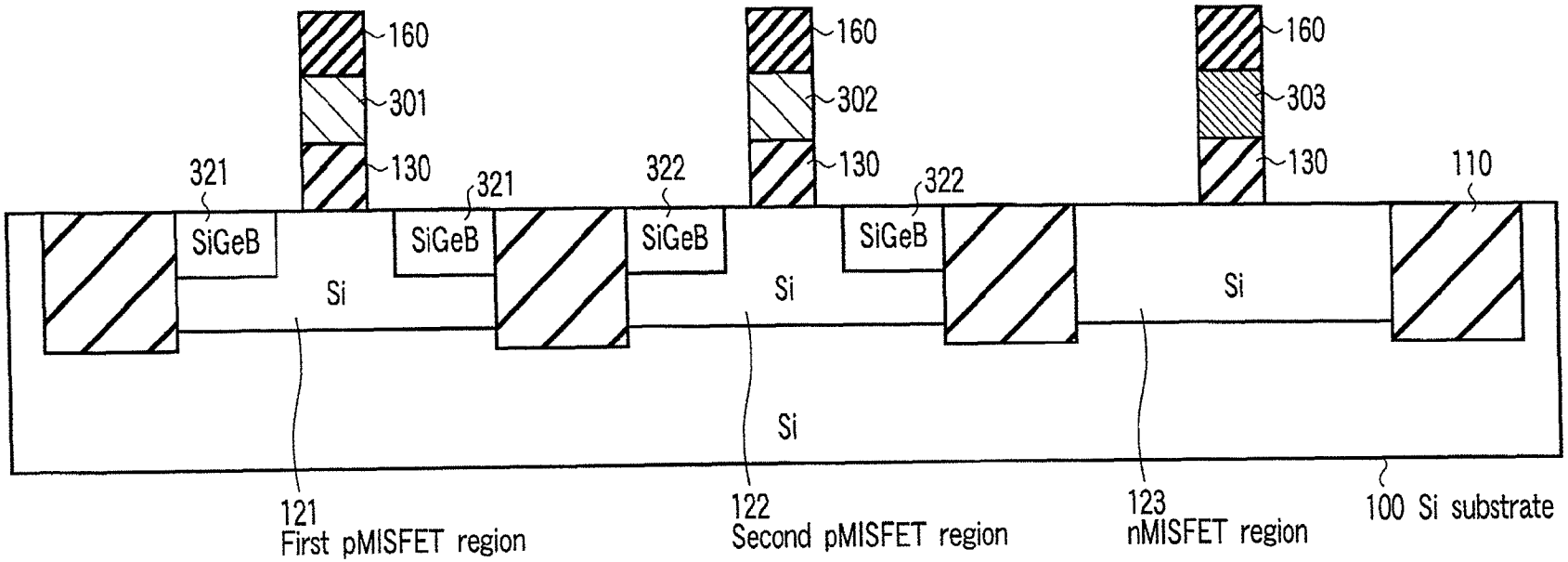
FIG. 1 is a cross-sectional view showing the schematic structure of a semiconductor device according to a first embodiment of this invention.

FIG. 1 is a cross-sectional view showing the schematic structure of a semiconductor device according to a first embodiment of this invention.

An element isolation insulating film 110 is formed on a surface portion (well) of an Si substrate 100 and a first pMISFET region 121, second pMISFET region 122 and nMISFET region 123 are formed in portions surrounded by the element isolation insulating film 110. A gate electrode 301 is formed above the pMISFET region 121 with a gate insulating film 130 disposed therebetween and source/drain regions are formed with the gate electrode 301 used as a mask so as to form a first p-channel MIS transistor. A gate electrode 302 is formed above the pMISFET region 122 with a gate insulating film 130 disposed therebetween and source/drain regions are formed with the gate electrode 302 used as a mask so as to form a second p-channel MIS transistor. Further, a gate electrode 303 is formed above the nMISFET region 123 with a gate insulating film 130 disposed therebetween and source/drain regions are formed with the gate electrode 303 used as a mask so as to form an nMIS transistor.

In the first pMISFET region 121, first SiGeB films 321 are formed in the source/drain regions which sandwich the Si channel. The SiGeB film 321 is formed by doping B used as a p-type impurity into the SiGe layer which applies compression strain to the Si channel, and as a result, the mobility in the first pMIS transistor is enhanced. Likewise, in the second pMISFET region 122, second SiGeB films 322 are formed in the source/drain regions which sandwich the Si channel. Like the SiGeB film 321, the SiGeB film 322 also applies compression strain to the Si channel, and as a result, the mobility in the second pMIS transistor is enhanced.

The first SiGeB films 321 formed in the first pMISFET region 121 and the second SiGeB films 322 formed in the second pMISFET region 122 are different in the Ge concentration. That is, the Ge concentration of the first SiGeB film 321 is higher than that of the second SiGeB film 322. Therefore, stresses applied to the respective Si channels of the first and second pMISFET regions 121 and 122 are different.

More specifically, the compression stress applied to the Si channel of the first pMISFET region 121 is larger than the compression stress applied to the Si channel of the second pMISFET region 122. Therefore, the strain amount for the Si channel of the first pMISFET region 121 becomes larger than the strain amount for the Si channel of the second pMISFET region 122. As a result, the first pMISFET region 121 is suitable for formation of elements having high drivability and the second pMISFET region 122 is suitable for formation of elements having high reliability.

Next, the manufacturing method of the semiconductor device according to the present embodiment is explained with reference to FIGS. 2A to 2L.

Figure 2A:
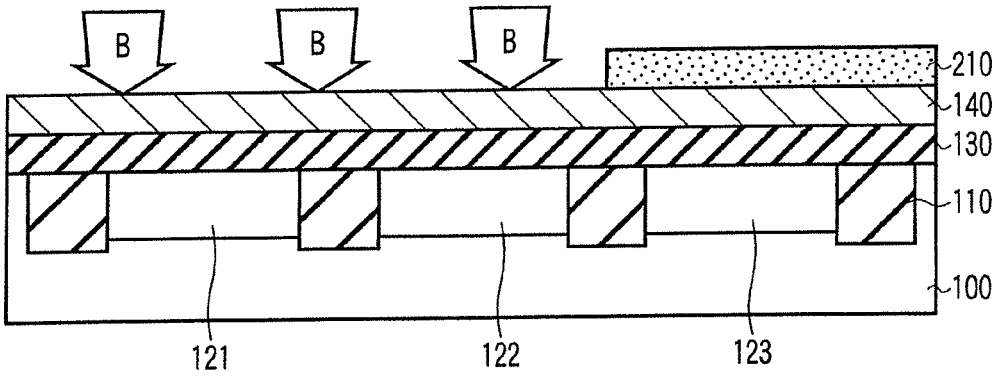
FIGS. 2A to 2L are cross-sectional views showing manufacturing steps of the semiconductor device according to the first embodiment.

First, as shown in FIG. 2A, an Si substrate 100 having an element isolation insulating film 110 formed on a well of the surface portion is prepared. On the Si substrate 100, a first pMISFET region 121, second pMISFET region 122 and pMISFET region 123 which are isolated from one another by the element isolation insulating film 110 are formed.

Then, a gate insulating film 130 is formed on the entire surface of the Si substrate 100 by the use of a low-pressure chemical vapor deposition (LPCVD) method. For example, a material of the gate insulating film 130 is a silicon oxide film (SiO2), silicon oxynitride film (SiON) or ferroelectric gate insulating film (Hi-k) and the thickness thereof is 2 nm. After this, a polysilicon film 140 is formed on the entire surface of the gate insulating film 130 by the use of the LPCVD method. The thickness of the polysilicon film 140 is 100 nm.

Next, a resist pattern 210 is formed on the polysilicon film 140 to cover the nMISFET region 123 by the use of lithography. Then, boron (B) is implanted into a portion of the polysilicon film 140 which lies above the first and second pMISFET regions 121 and 122 by the use of an ion-implantation technique with the resist pattern 210 used as a mask.

Figure 2B:
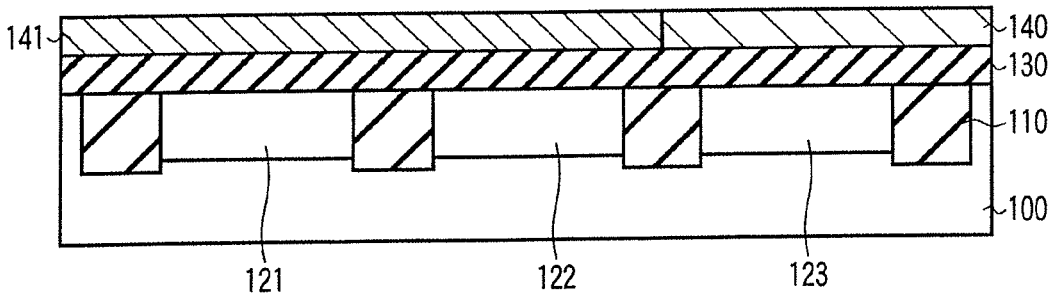

As shown in FIG. 2B, a $p^+$-type polysilicon film 141 is formed above the first and second pMISFET regions 121 and 122 by the above ion-implantation process of B. After this, the resist pattern 210 is removed by wet etching.

Figure 2C:
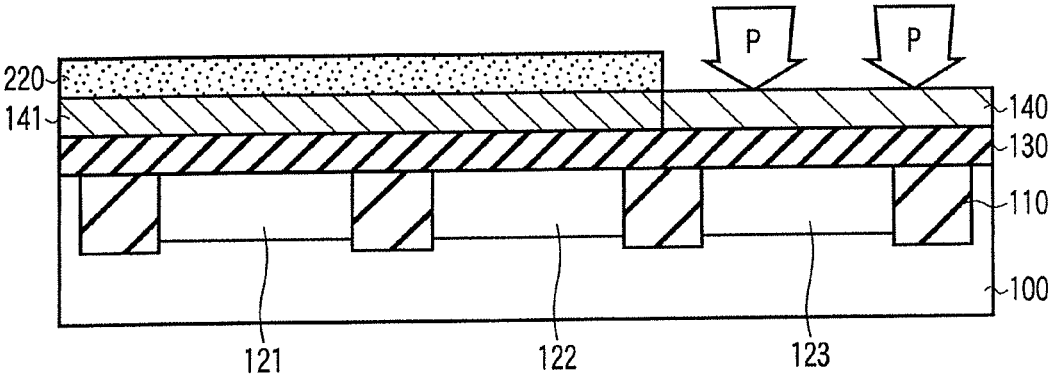

Next, as shown in FIG. 2C, a resist pattern 220 is formed to cover the first and second pMISFET regions 121 and 122 by the use of lithography. Then, phosphorus (P) is implanted into the polysilicon film 140 with the resist pattern 220 used as a mask.

Figure 2D:
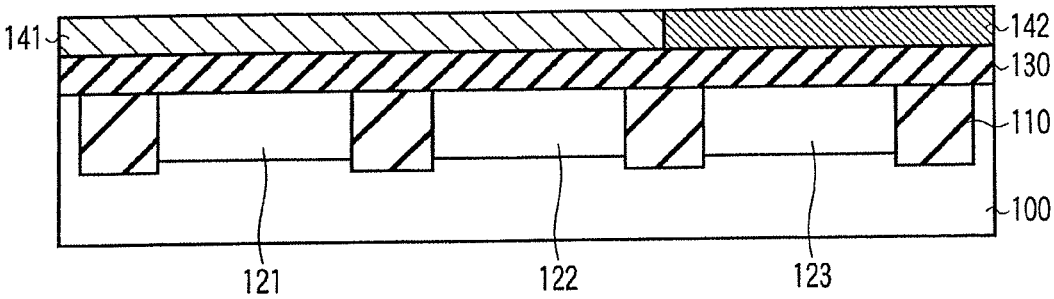

As shown in FIG. 2D, an $n^+$-type polysilicon film 142 is formed above the nMISFET region 123 by the above ion-implantation process of P. After this, the resist pattern 220 is removed by wet etching.

Figure 2E:
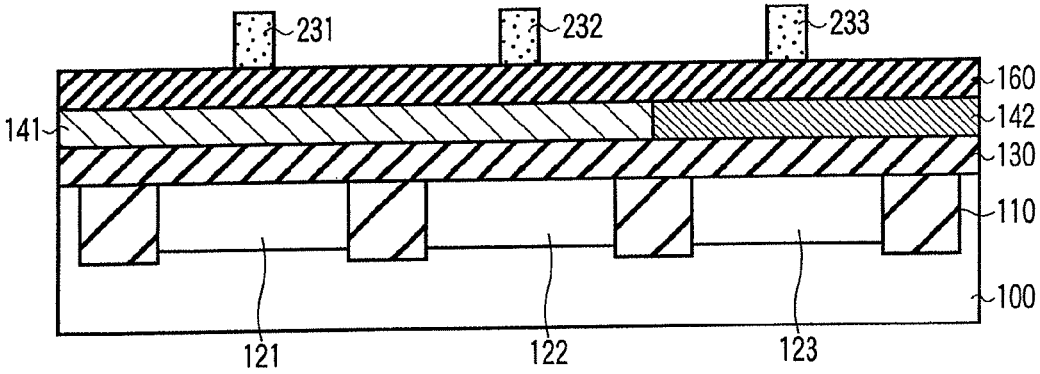

Next, as shown in FIG. 2E, a hard mask 160 is formed on the entire surface of the resultant structure by the use of the LPCVD method. For example, the hard mask 160 is a composite film containing TEOS and silicon nitride (SiN), the thickness of TEOS is 40 nm and the thickness of SiN is 60 nm. Then, a first gate electrode pattern 231, second gate electrode pattern 232 and third gate electrode pattern 233 formed of resist are formed on the hard mask 160 by the use of lithography.

Figure 2F:
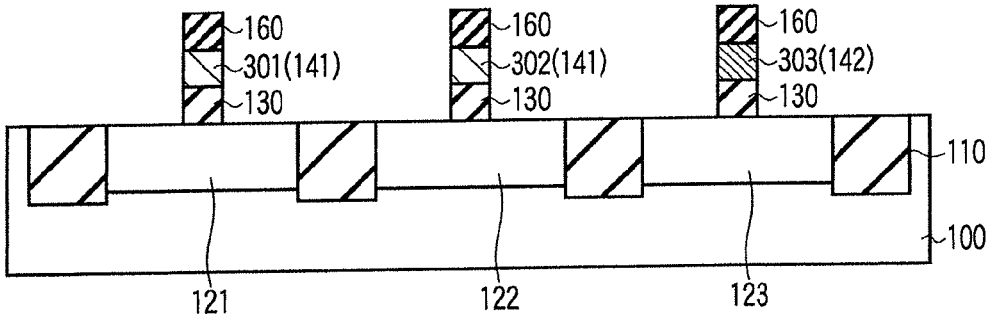

Next, as shown in FIG. 2F, a first gate electrode 301, second gate electrode 302 and third gate electrode 303 are formed by the use of a reactive ion etching (RIE) method. Specifically, the hard mask 160 is selectively etched by the use of the RIE method while the electrode patterns 231, 232 and 233 formed of resist are used as a mask. Then, the $p^+$-type polysilicon film 141 and $n^+$-type polysilicon film 142 are selectively etched by the use of the RIE method while the thus etched hard masks 160 are used as a mask so as to form the gate electrodes 301, 302, 303. After this, the first gate electrode pattern 231, second gate electrode pattern 232 and third gate electrode pattern 233 are removed by wet etching.

Figure 2G:
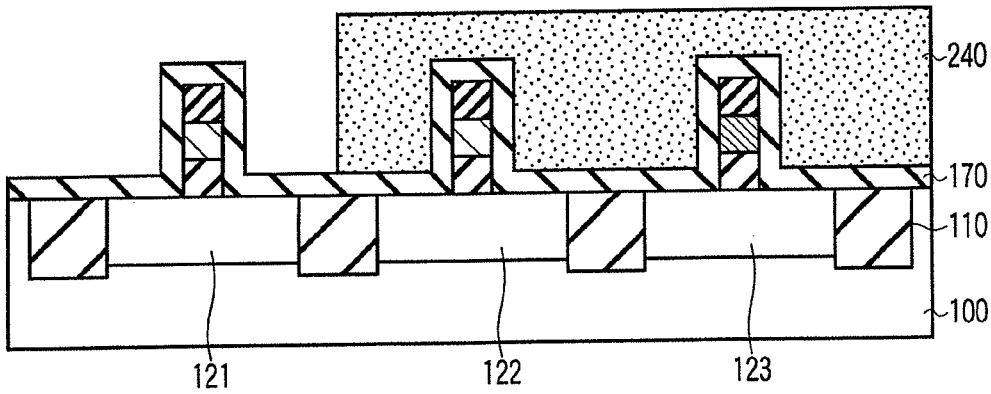

Next, as shown in FIG. 2G, a tin film 170 used as sidewall films is formed by the use of the LPCVD method. A material of the thin film 170 is TEOS, for example, and the thickness thereof is 40 nm. As the thin film 170, SiN can be used instead of TEOS. Then, a resist pattern 240 is formed to cover the second pMISFET region 122 and nMISFET region 123 by the use of lithography.

Figure 2H:
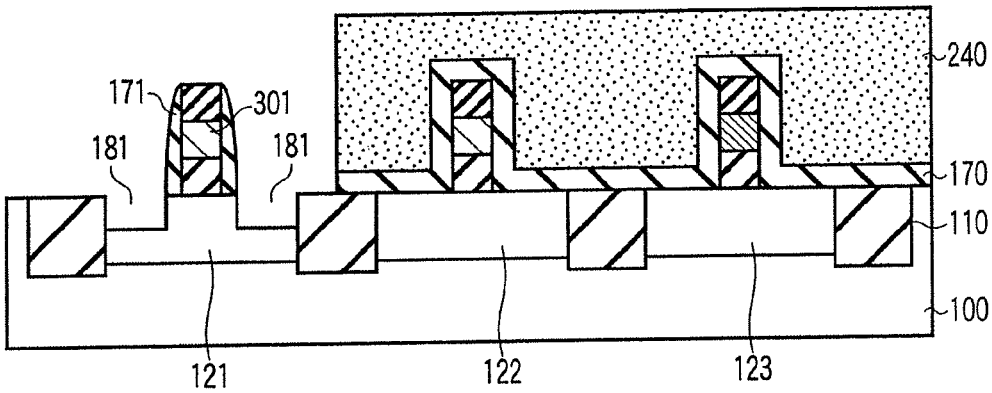

Next, as shown in FIG. 2H, in the first pMISFET region 121, the thin film 170 is left behind only on the sidewalls of the gate electrode 301 by selectively etching the thin film 170 by a preset amount by the use of the RIE method. That is, sidewall films 171 are formed on the gate side portions of the first pMISFET region 121. Then, recesses 181 which sandwich the Si channel are formed in the first pMISFET region 121 by wet etching. For example, the depth of the recess 181 is 60 nm.

Figure 2I:
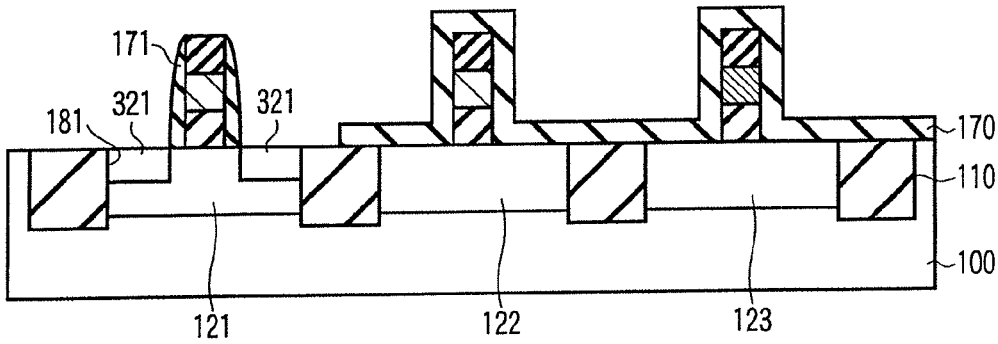

Next, as shown in FIG. 2I, first SiGeB films 321 are grown and formed in the recesses 181 by the use of the LPCVD method. The thickness of the first SiGeB film 321 is 60 nm and the Ge concentration thereof is 20%. B in the SiGeB film 321 acts as a p-type impurity and it is possible to dope an impurity other than B.

Figure 2J:
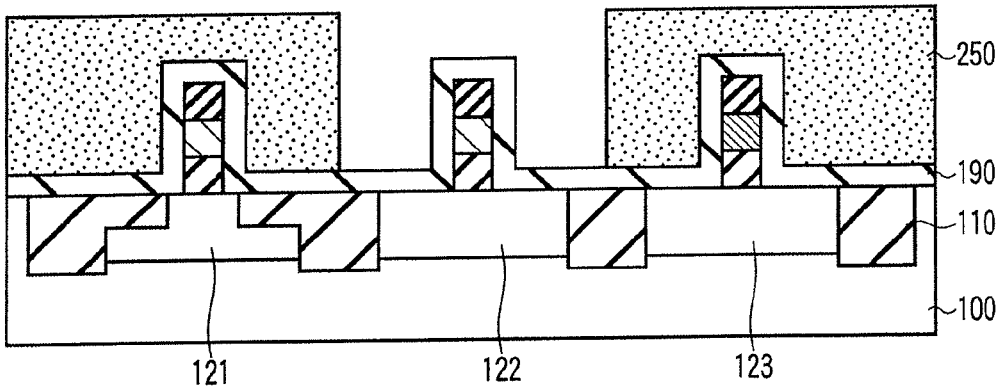

Next, as shown in FIG. 2J, after the thin film 170 and sidewall films 171 are removed by wet etching, a thin film 190 used sidewall films is formed by the use of the LPCVD method. A material of the thin film 190 is TEOS, for example, and the thickness thereof is 40 nm. Then, a resist pattern 250 is formed to cover the first pMISFET region 121 and nMISFET region 123 by the use of lithography.

Figure 2K:
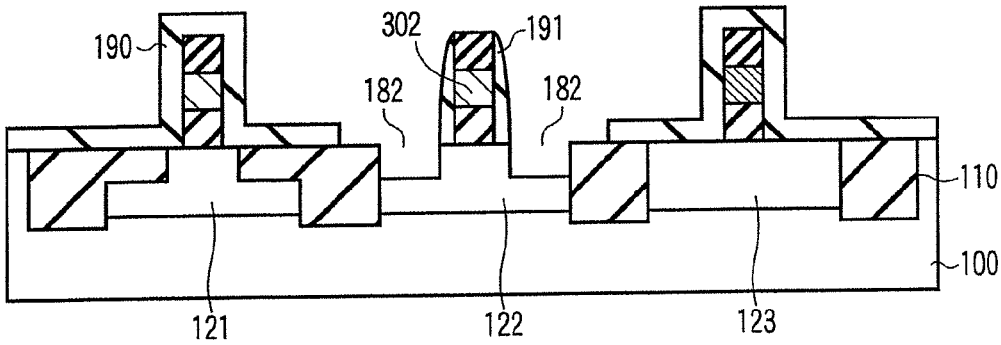

Next, as shown in FIG. 2K, in the second pMISFET region 122, the thin film 190 is left behind only on the sidewalls of the gate electrode 302 by selectively etching the thin film 190 by a preset amount by the use of the RIE method. That is, sidewall films 191 are formed on the gate side portions of the second pMISFET region 122. Then, recesses 182 which sandwich the Si channel are formed in the second pMISFET region 122 by wet etching. For example, the depth of the recess 182 is 60 nm. In this case, the depths of the recesses 181 and 182 may be made different.

Figure 2L:
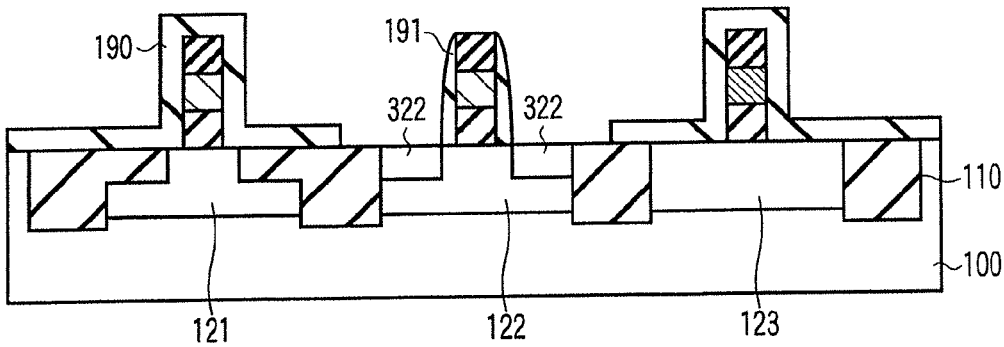

Next, as shown in FIG. 2L, second SiGeB films 322 are grown and formed in the recesses 182 by the use of the LPCVD method. The thickness of the second SiGeB film 322 is 60 nm and the Ge concentration thereof is 15%. That is, the Ge concentration of the second SiGeB film 322 is lower than that of the first SiGeB film 321.

After this, the thin film 190 and sidewall films 191 are removed by wet etching and the semiconductor device with the structure shown in FIG. 1 can be attained.

Although not shown in FIG. 1, extension layers may be formed between the first SiGeB films 321 and the channel region below the gate electrode 301 in the first pMISFET region 121 and extension layers may be formed between the second SiGeB films 322 and the channel region below the gate electrode 302 in the second pMISFET region 122.

Thus, in the present embodiment, the strain amount for the first pMISFET region 121 is set larger than the strain amount for the second pMISFET region 122 by making different the GE concentrations of the first SiGeB film 321 formed in the first pMISFET region 121 and the second SiGeB film 322 formed in the second pMISFET region 122. Ideally, the GE concentration of the SiGeB film 321 in the first pMISFET region 121 required to have the high drivability is set in a range of 18 to 30% and the GE concentration of the SiGeB film 322 in the second pMISFET region 122 required to have the high reliability is set in a range of 5 to 15%.

Therefore, the transistor in the first pMISFET region 121 has high drivability and the transistor in the second pMISFET region 122 has high reliability. That is, a pMISFET having high drivability and a pMISFET having high reliability can be formed together in one chip. Therefore, the quality of a CMOS transistor can be enhanced.

Figure 3:
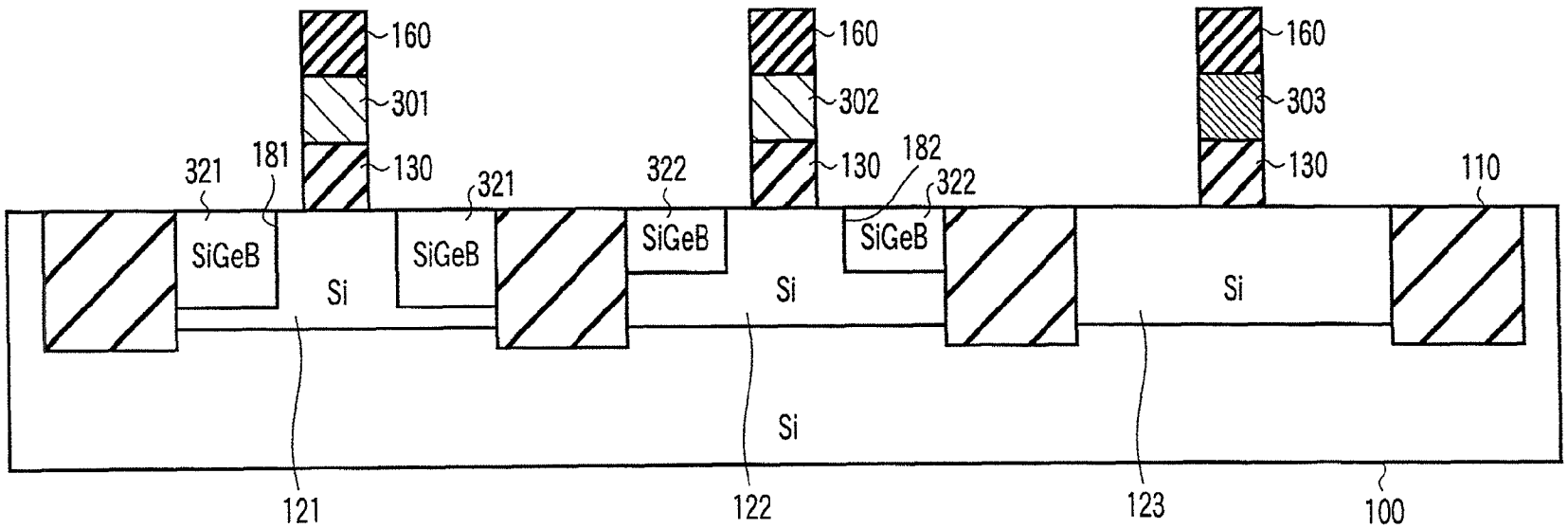
FIG. 3 is a cross-sectional view showing the schematic structure of a semiconductor device according to a modification of the first embodiment.

The strain amount of the Si channel depends on the GE concentration of the SiGeB films which sandwich the Si channel but it also depends on the thickness of the SiGeB film. The strain amount becomes larger as the SiGeB film becomes thicker. Therefore, as shown in FIG. 3, the Si channel strain for the first pMISFET region 121 can be made larger by making different the depths of the recesses 181 and 182 in the first pMISFET region 121 and second pMISFET region 122 and forming the first SiGeB film 321 thicker than the second SiGeB film 322. Ideally, the depth of the SiGeB film 321 in the pMISFET region 121 required to have the high drivability is set in a range of 75 to 100 nm and the depth of the SiGeB film 322 in the pMISFET region 122 required to have the high reliability is set in a range of 30 to 60 nm.

With the above structure, the strain amount for the first pMISFET region 121 can be set larger than the strain amount for the second pMISFET region 122 and the quality of a CMOS transistor can be enhanced. Further, not only one of the Ge concentration and the recess depth is changed but also both of them can be changed.

Second Embodiment

Figure 4:
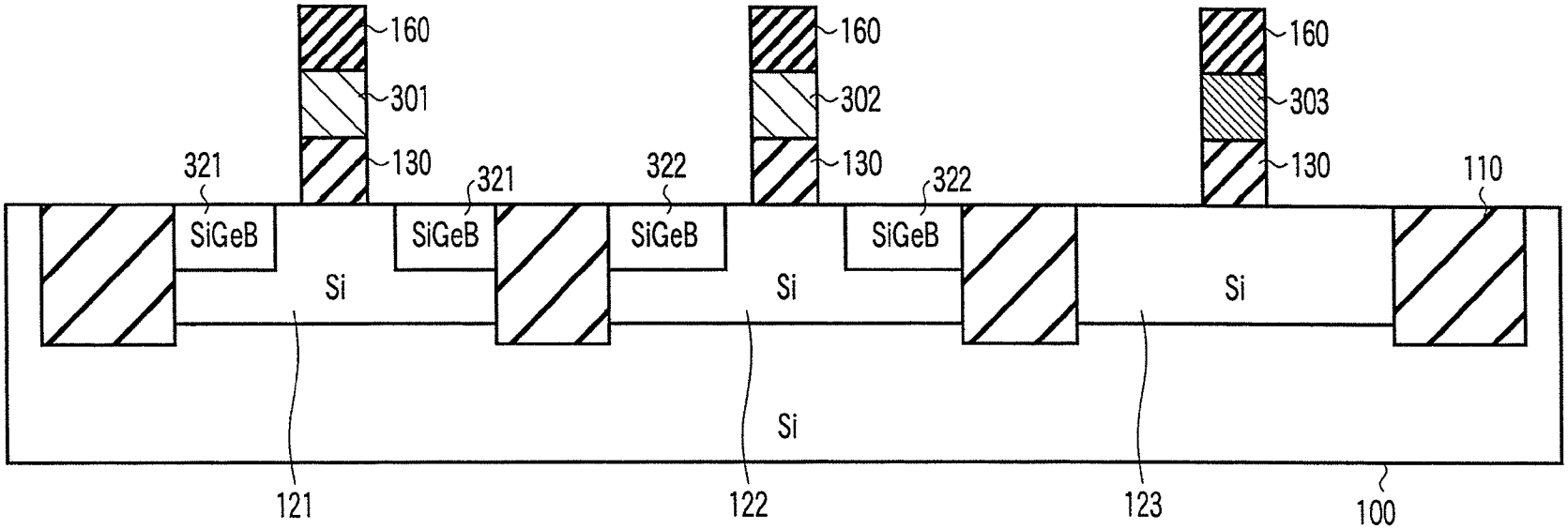
FIG. 4 is a cross-sectional view showing the schematic structure of a semiconductor device according to a second embodiment of this invention.

FIG. 4 is a cross-sectional view showing the schematic structure of a semiconductor device according to a second embodiment of this invention. The same symbols are attached to the same portions as those of FIG. 1 and the detail explanation thereof is omitted.

Figure 5A:
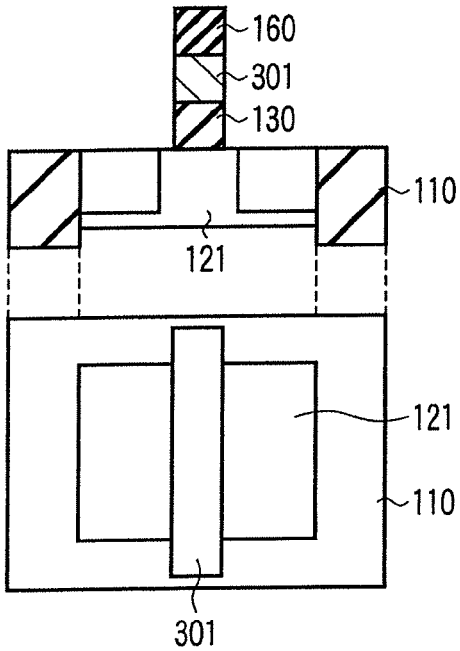
FIGS. 5A and 5B are plan views showing the relationship between the Si aperture ratios of first and second pMISFET regions.
Figure 5B:
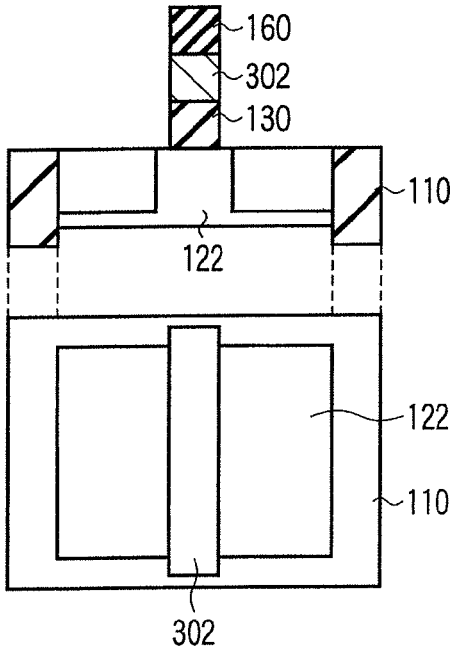

The present embodiment is different from the first embodiment in that the areas of element isolation insulating films in the respective pMISFET regions are made different in order to change the Ge concentrations in the SiGe films. That is, as shown in FIGS. 5A and 5B, the areas of element isolation insulating films 110 in a first pMISFET region 121 and second pMISFET region 122 are made different. The area of the element isolation insulating film 110 is made larger in the first pMISFET region 121, and as a result, the area of the first pMISFET region 121 is made smaller than that of the second pMISFET region 122.

In this case, in one cell region containing a MISFET region and element isolation region, the ratio of an exposed area of an Si substrate to the entire area of the cell region is defined as an Si aperture ratio. More specifically, the ratio of the area in which the SiGe film is formed in an area of 1 $mm^2$ near the MISFET region is defined as an Si aperture ratio. By changing the Si aperture ratio, the Ge concentration in the SiGe film can be changed. Examples of FIGS. 5A and 5B are obtained by changing the areas of the element isolation insulating films 110 to change the Si aperture ratios.

Specifically, the Si aperture ratio in the range of 1 $mm^2$ of the pMISFET region 121 required to have the high drivability is set lower than the Si aperture ratio in the range of 1 $mm^2$ of the pMISFET region 122 required to have the high reliability by at least 5%. For example, the Si aperture ratio of the pMISFET region 121 is set to 5% and the Si aperture ratio of the pMISFET region 122 is set to 10%.

Figure 6:
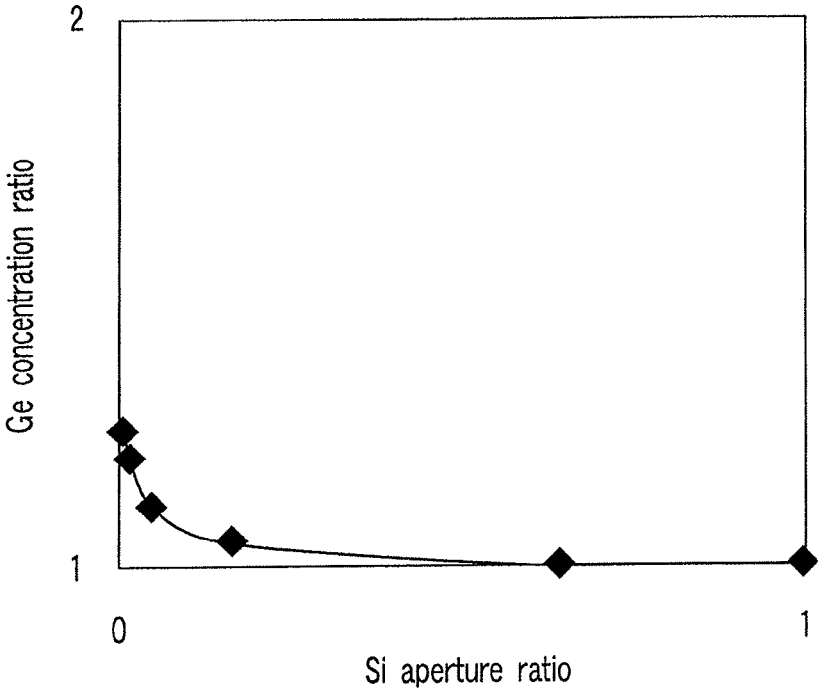
FIG. 6 is a characteristic diagram showing the relationship between the Si aperture ratio in the growing process of an SiGe layer and the Ge concentration.

FIG. 6 is a characteristic diagram showing the relationship between the Si aperture ratio and the Ge concentration of an SiGe layer grown. It is understood that the Ge concentration becomes higher as the Si aperture ratio becomes lower. Further, the same result was obtained in a case where B was doped as an impurity.

In the case of FIG. 4, the first and second pMISFET regions 121 and 122 are arranged close to each other, but in an actual device, since the regions are sufficiently separated, the relationship as shown in FIG. 6 is established.

Thus, by setting the Si aperture ratio of the first pMISFET region 121 lower than that of the second pMISFET region 122, the Ge concentration of the SiGe layer 321 formed in the first pMISFET region 121 can be enhanced and the strain amount of the Si channel in the first pMISFET region 121 can be made larger. In this case, it is not necessary to separately grow SiGe layers in the first and second pMISFET regions 121 and 122 and it is possible to simultaneously form the SiGe layers. Therefore, the process can be simplified.

As a method for changing the Si aperture ratio, not only the method for changing the areas of the pMISFETs but also the following method can be considered.

Figure 7A:
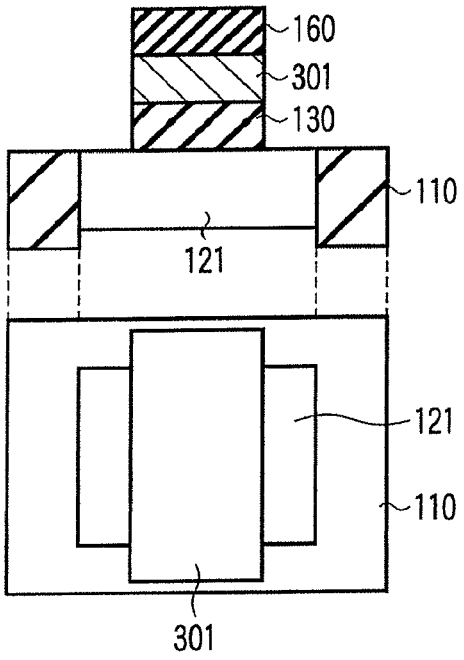
FIGS. 7A and 7B are plan views showing examples in which the Si aperture ratios of the first and second pMISFET regions are changed by changing the gate lengths.
Figure 7B:
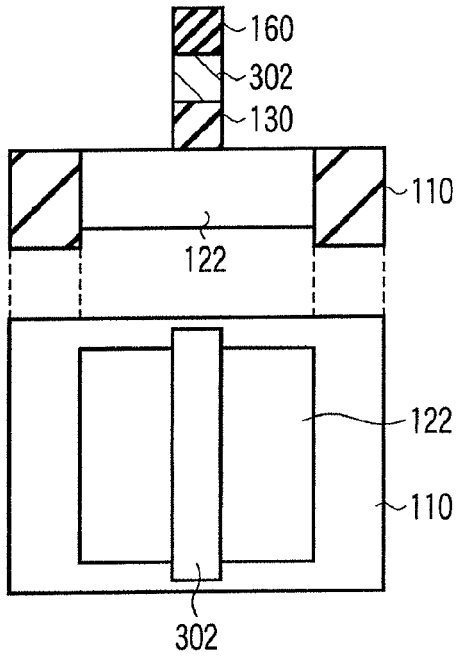

FIGS. 7A and 7B show examples in which the Si aperture ratios are changed by changing the dimensions of gate electrodes. FIG. 7A shows the first pMISFET region 121 and FIG. 7B shows the second pMISFET region 122. By making the gate length of the gate electrode 301 in the first pMISFET region 121 larger than that in the second pMISFET region 122, the Si aperture ratio of the first pMISFET region 121 can be set lower than that of the second pMISFET region 122.

Figure 8A:
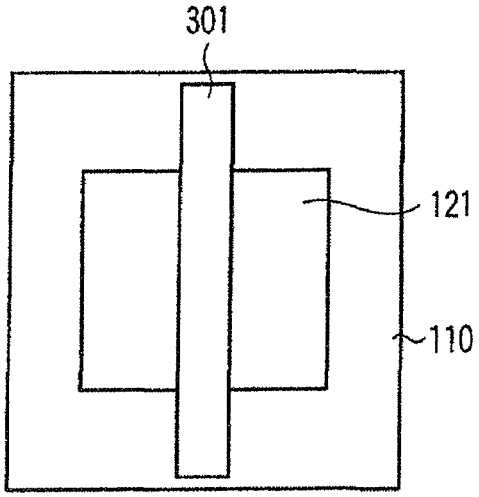
FIGS. 8A and 8B are plan views showing examples in which the Si aperture ratios of the first and second pMISFET regions are changed by changing the width W and length X of a MISFET region.
Figure 8B:
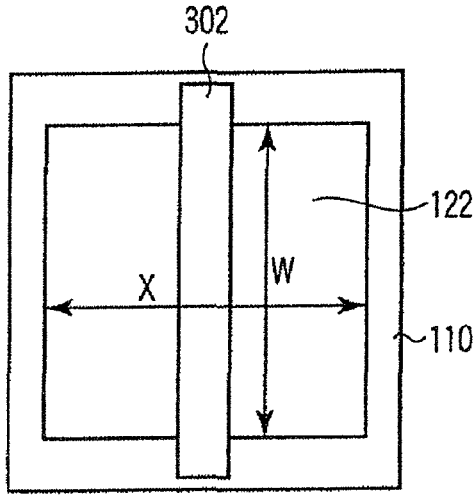

FIGS. 8A and 8B show examples in which the length X in the gate lengthwise direction of pMISFET formation regions and the length W in the gate width direction are changed. FIG. 8A shows the first pMISFET region 121 and FIG. 8B shows the second pMISFET region 122. By setting W×X in the first pMISFET region 121 smaller than that in the second pMISFET region 122, the Si aperture ratio of the first pMISFET region 121 can be set lower than that of the second pMISFET region 122.

Figure 9A:
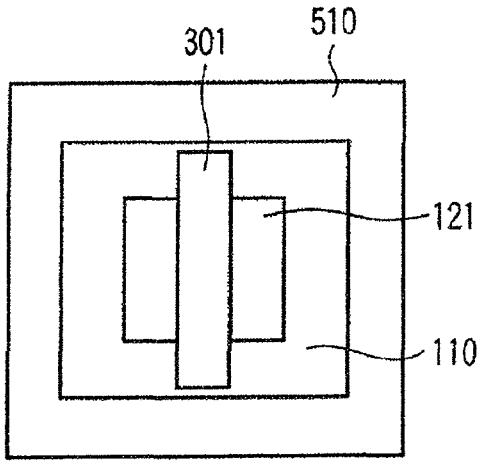
FIGS. 9A and 9B are plan views showing examples in which the Si aperture ratios of the first and second pMISFET regions are changed by using a region which is not associated with a circuit.
Figure 9B:
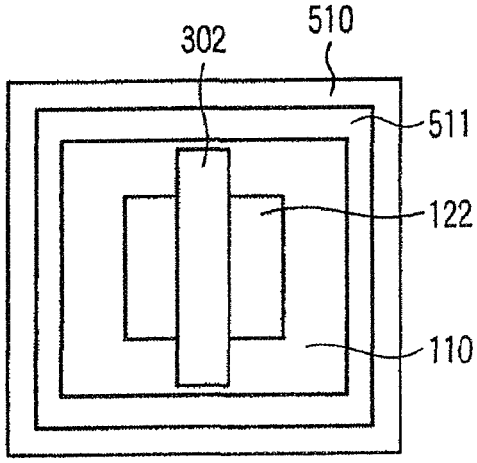

FIGS. 9A and 9B show a method for changing the Si aperture ratio without changing the areas and gate lengths of the pMISFET formation regions. FIG. 9A shows the first pMISFET region 121 and FIG. 9B shows the second pMISFET region 122. Generally, regions 510 (insulating films of $SiO_2$ which are the same as the element isolation insulating film) which do not contribute to the operation of the circuit are formed in the peripheral portions of the MISFET regions. The region 510 is left behind as it is in the first pMISFET region 121 and part of the region 510 which does not contribute to the operation of the circuit is etched in the second pMISFET region 122 to expose the underlying Si substrate. As a result, the Si aperture ratio of one cell region containing the first pMISFET region 121 can be made lower than that of one cell region containing the second pMISFET region 122.

The Si aperture ratio is explained with respect to the MISFET formation region or one cell region, but in an actual device, a plurality of elements required to have a high-speed operation and a plurality of elements required to have high reliability are formed in separate regions in many cases. Therefore, the ratio of an exposed area of Si to the area of an entire region in which the element group is arranged is defined as an Si aperture ratio and the Si aperture ratios for the entire region in which the element group required to have the high-speed operation is arranged and for the entire region in which the element group required to have the high reliability is arranged may be made different.

Next, a manufacturing method of the semiconductor device of the present embodiment is explained with reference to FIG. 10. In this example, a method for changing the areas of the pMISFET regions to change the Si aperture ratios in the two pMISFET regions 121, 122 as shown in FIGS. 5A, 5B is provided.

First, like the first embodiment, an element isolation insulating film 110 is formed on an Si substrate 100 and gate electrodes 301, 302, 303 are respectively formed above a first pMISFET region 121, second pMISFET region 122 and nMISFET region 123 with respective gate insulating films 130 disposed therebetween. The process up to the above step is the same as the process of FIGS. 2A to 2F. However, the element isolation insulating film 110 is different in size in the pMISFET regions 121, 122. That is, as shown in FIGS. 5A, 5B, the area of the first pMISFET region 121 is made smaller than that of the second pMISFET region 122. Thus, the Si aperture ration in the first pMISFET region 121 is made lower than that in the second pMISFET region 122.

Figure 10A:
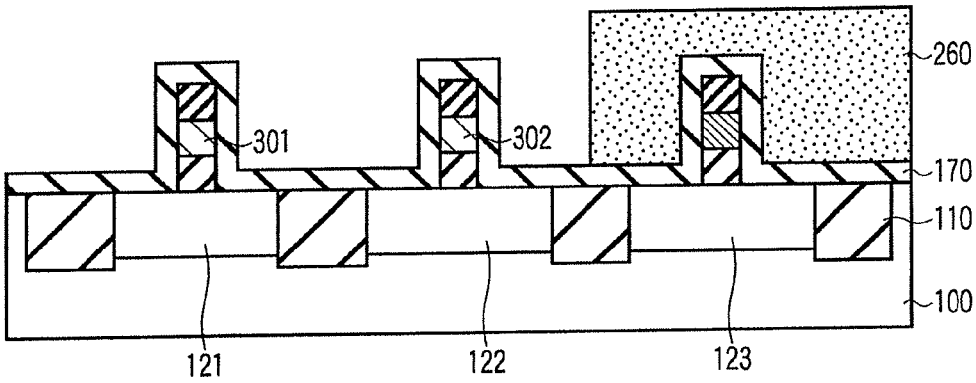
FIGS. 10A to 10D are cross-sectional views showing manufacturing steps of the semiconductor device according to the second embodiment.

In the present embodiment, as shown in FIG. 10A, after a thin film 170 used as sidewall films is formed by the use of the LPCVD method after the step of FIG. 2F, a resist pattern 260 which covers the nMISFET region 123 is formed by the use of lithography.

Figure 10B:
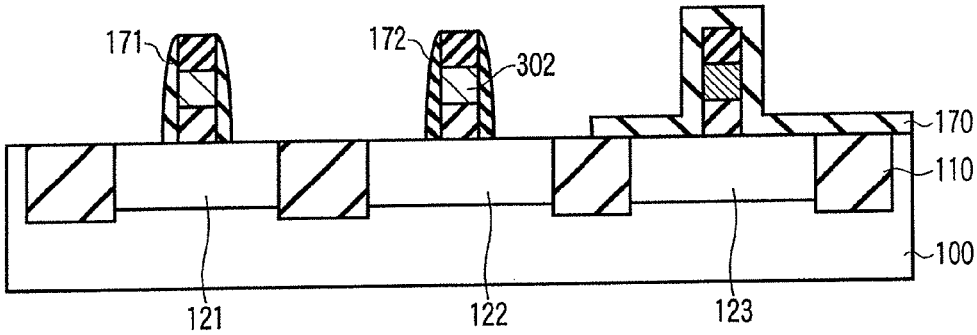

Then, as shown in FIG. 10B, the thin film 170 is left behind only on the sidewalls of the gate electrodes 301, 302 by selectively etching the thin film 170 by a preset amount by the use of the RIE method. That is, first sidewall films 171 are formed on the gate side portions of the first pMISFET region 121 and second sidewall films 172 are formed on the gate side portions of the second pMISFET region 122.

Figure 10C:
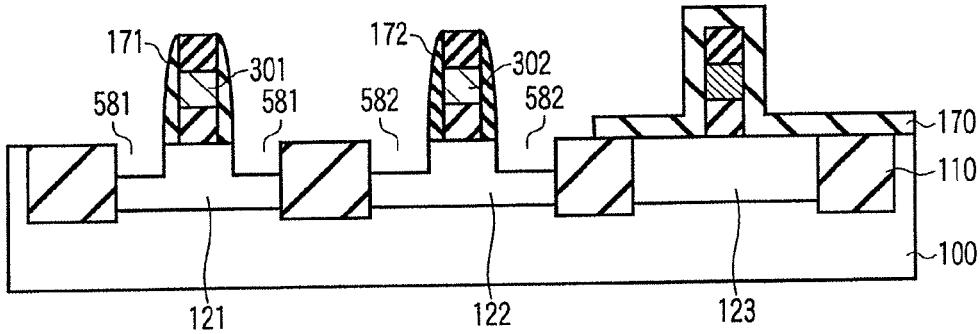

After this, as shown in FIG. 10C, recesses 581 are formed in the first pMISFET region 121 by wet etching, and at the same time, recesses 582 are formed in the second pMISFET region 122. In this case, the depths of the recesses 581, 582 are both set to 60 nm. The depths of the recesses 581, 582 may be made different.

Figure 10D:
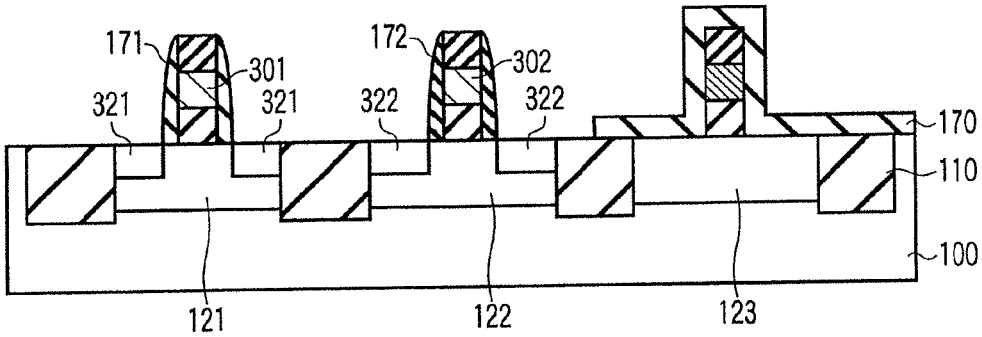

Next, as shown in FIG. 10D, first SiGeB films 321 are grown and formed in the recesses 581 and second SiGeB films 322 are grown and formed in the recesses 582 by the use of the LPCVD method. At this time, since the Si aperture ratio of the first pMISFET region 121 is lower than that of the second pMISFET region 122, the Ge concentration and B concentration of the first SiGeB films 321 become higher than those of the second SiGeB films 322.

Next, the first sidewall films 171, second sidewall films 172 and thin film 170 are removed by wet etching to attain the structure shown in FIG. 4.

According to the present embodiment, the Ge concentration of the first SiGeB films 321 in the first pMISFET region 121 can be made higher than that in the second pMISFET region 122 by utilizing the difference in the Si aperture ratios of the two pMISFET regions 121, 122. Therefore, the strain amount for the first pMISFET region 121 in the same chip can be made larger than the strain amount for the second pMISFET region 122 and the same effect as that of the first embodiment can be attained. Further, since it is not necessary to separately form masks for the first pMISFET region 121 and second pMISFET region 122, the number of steps of a mask process can be reduced and an advantage that the process is simplified can be attained.

(Modification)

This invention is not limited to the above embodiments. In the above embodiments, the SiGeB film is used as one example of the SiGe layer, but an SiGeC film may be used instead of the SiGeB film. That is, not only the SiGe layer but also a layer obtained by doping impurity into SiGe can be used.

Further, in the above embodiment, the strain amounts applied to the Si channels in the first and second pMISFET regions are changed by changing the Ge concentration in the SiGe layer, but the strain amount can also be changed by changing the thickness of the SiGe layer. Specifically, the strain amount can be made larger as the thickness of the SiGe layer becomes larger. Therefore, transistors with the high drivability can be formed in the first pMISFET region and transistors with the high reliability can be formed in the second pMISFET region by making the Si etching depth larger in the first pMISFET region and making the Si etching depth smaller in the second pMISFET region.

In the above embodiments, the explanation is made with reference to the pMISFET regions, but in this invention, the same effect can be attained by changing the C concentration when C-doped Si regions are formed to sandwich the Si channel in the nMISFET region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate, a first pMISFET formed on the semiconductor substrate and having a first Si channel formed on a surface of the semiconductor substrate, and first SiGe layers, which apply first compression strain to the first Si channel, embedded in the surface of the semiconductor substrate to sandwich the first Si channel, a second pMISFET formed on the semiconductor substrate to be electrically isolated from the first pMISFET and having a second Si channel formed on a surface of the semiconductor substrate, and second SiGe layers, which apply second compression strain different from the first compression strain to the second Si channel, embedded in the surface of the semiconductor substrate to sandwich the second Si channel, and an nMISFET formed on the semiconductor substrate to be electrically isolated from the first pMISFET and the second pMISFET and having a third Si channel formed on a surface of the semiconductor substrate.

2. The semiconductor device according to claim 1, wherein the first and second SiGe layers respectively contain B or C as an impurity.

3. The semiconductor device according to claim 1, wherein Ge concentrations of the first and second SiGe layers are different.

4. The semiconductor device according to claim 1, wherein depths of the first and second SiGe layers from the surface of the substrate are different.

5. The semiconductor device according to claim 1, wherein Si aperture ratios of the first pMISFET and the second pMISFET are different in a case where a ratio of an area of an exposed Si substrate to an area of 1 $mm^2$ including one cell region containing one MISFET therein and an element isolation region surrounding the MISFET is defined as an Si aperture ratio.

*6. A semiconductor device comprising:*

*a semiconductor layer,*

*a first pMISFET formed on the semiconductor layer and having a first channel formed on a surface of the semiconductor layer, first SiGe layers, which apply first compression strain to the first channel, embedded in the surface of the semiconductor layer to sandwich the first channel,*

*a second pMISFET formed on the semiconductor layer to be electrically isolated from the first pMISFET and having a second channel formed on a surface of the semiconductor layer, second SiGe layers, which apply second compression strain different from the first compression strain to the second channel, embedded in the surface of the semiconductor layer to sandwich the second channel, and*

*an nMISFET formed on the semiconductor layer to be electrically isolated from the first pMISFET and the second pMISFET and having a third channel formed on a surface of the semiconductor layer.*

*7. The semiconductor device according to claim 6, wherein the first and second SiGe layers respectively contain B or C as an impurity.*

*8. The semiconductor device according to claim 6, wherein Ge concentrations of the first and second SiGe layers are different.*

*9. The semiconductor device according to claim 6, wherein depths of the first and second SiGe layers from the surface of the semiconductor layer are different.*

*10. The semiconductor device according to claim 6, wherein semiconductor-layer aperture ratios of the first pMISFET and the second pMISFET are different in a case where a ratio of an area of an exposed semiconductor layer to an area of 1 $mm^2$ containing one MISFET and an element isolation region surrounding the MISFET is defined as a semiconductor-layer aperture ratio.*

*11. The semiconductor device according to claim 10, wherein the first pMISFET is different from the second pMISFET in a length in a gate-length direction between an inner edge of the element isolation region and an opposite inner edge of the element isolation region which is surrounding the MISFET.*

*12. The semiconductor device according to claim 10, wherein the first pMISFET is different from the second pMISFET in a length in a gate-width direction between an inner edge of the element isolation region and an opposite inner edge of the element isolation region which is surrounding the MISFET.*

*13. The semiconductor device according to claim 6, wherein the first SiGe layers are different from the second SiGe layers in an impurity concentration and a thickness regarding each of the first and second SiGe layers.*

*14. The semiconductor device according to claim 10, wherein mobility of the first pMISFET is higher than that of the second pMISFET.*

* * * * *